(12) United States Patent
Ali et al.

(10) Patent No.: US 7,221,191 B2
(45) Date of Patent: May 22, 2007

(54) SIGNAL SAMPLERS WITH ENHANCED DYNAMIC RANGE

(75) Inventors: Ahmed Mohamed Abdelatty Ali, Oak Ridge, NC (US); Christopher Daniel Dillon, Greensboro, NC (US)

(73) Assignee: Analog Devices, Inc., Norwood, MA (US)

(*) Notice: Subject to any disclaimer, the term of this patent is extended or adjusted under 35 U.S.C. 154(b) by 77 days.

(21) Appl. No.: 11/187,061

(22) Filed: Jul. 21, 2005

(65) Prior Publication Data

US 2006/0261861 A1    Nov. 23, 2006

Related U.S. Application Data

(60) Provisional application No. 60/683,958, filed on May 23, 2005.

(51) Int. Cl.
  *G11C 27/02*     (2006.01)
(52) U.S. Cl. .................................. 327/94; 341/122
(58) Field of Classification Search .................. 327/77, 327/91, 93, 94, 95, 96, 337, 554, 92; 341/122, 341/136, 143, 161, 172
See application file for complete search history.

(56) References Cited

U.S. PATENT DOCUMENTS

| | | | | |
|---|---|---|---|---|
| 5,982,205 | A * | 11/1999 | Vallancourt ................... | 327/94 |
| 6,340,945 | B1 * | 1/2002 | Hauptmann et al. ......... | 341/172 |
| 6,384,758 | B1 * | 5/2002 | Michalski et al. ........... | 341/122 |
| 6,570,411 | B1 * | 5/2003 | Bardsley et al. ............... | 327/94 |
| 6,650,263 | B1 * | 11/2003 | Dillon ........................ | 341/122 |
| 6,778,013 | B1 | 8/2004 | Ali .............................. | 330/252 |
| 6,859,159 | B2 * | 2/2005 | Michalski ................... | 341/172 |
| 6,882,292 | B1 | 4/2005 | Bardsley et al. ............ | 341/121 |
| 7,119,584 | B1 * | 10/2006 | Ali .............................. | 327/91 |

OTHER PUBLICATIONS

Mehr, Iuri, et al., "A 55-mW, 10-bit,40-Msample/s Nyquist-Rate CMOS ADC", IEEE Journal of Solid-State Circuits, vol. 35, No. 3, Mar. 2000, pp. 318-325.

Liu, Ming-Huang, et al., "A 1.5 V 12-bit 16 MSPS CMOS Pipelined ADC with 68 dB Dynamic Range", Analog Integrated Circuits and Signal Processing, Feb. 2004, pp. 269-278.

* cited by examiner

*Primary Examiner*—Kenneth B. Wells
*Assistant Examiner*—Thomas J. Hiltunen
(74) *Attorney, Agent, or Firm*—Koppel, Patrick, Heybl & Dawson

(57) ABSTRACT

Signal sampler embodiments are provided for processing input signals along signal paths in response to mode-command signals. They include a follower transistor with a control terminal and a current terminal that establish at least part of a signal path. They also include a switched-capacitor network that receives signals from the current terminal in response to a first mode-command signal and that couple a selected one of a set of reference signals to the current terminal in response to a second mode-command signal. During a second mode-command signal, a bias switch is arranged to bias off the follower transistor by coupling a bias signal to the control terminal that approximates the selected reference signal. Accordingly, the amplitude of the reference signals can be increased to facilitate an increased dynamic range of the input signals without biasing the follower transistor into breakdown.

20 Claims, 3 Drawing Sheets

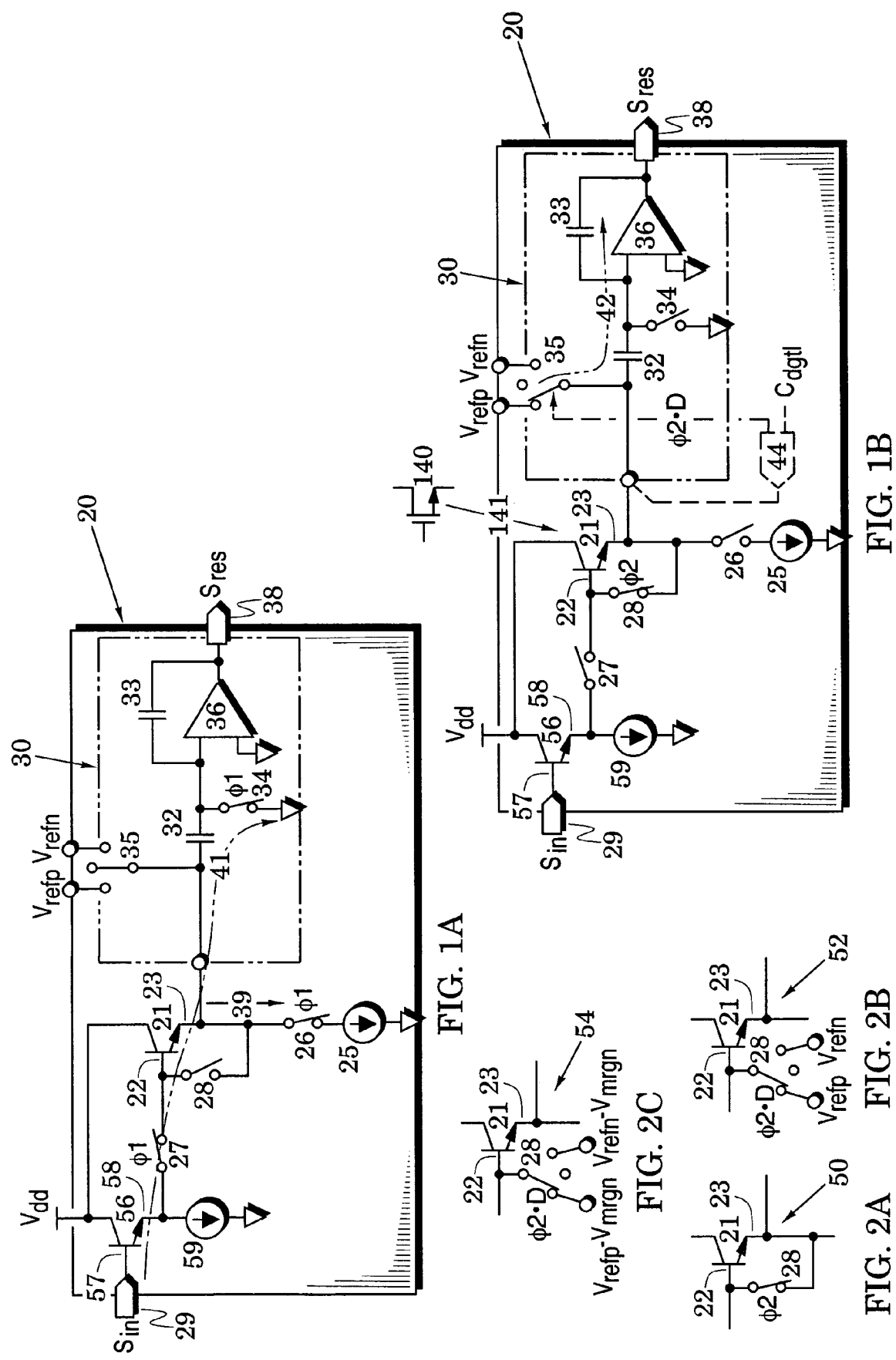

SIGNAL SAMPLERS WITH ENHANCED DYNAMIC RANGE

CROSS REFERENCES TO RELATED APPLICATIONS

This application claims the benefit of U.S. Provisional Application Ser. No. 60/683,958 filed May 23, 2005.

BACKGROUND OF THE INVENTION

1. Field of the Invention

The present invention relates generally to signal samplers.

2. Description of the Related Art

In a variety of signal conditioning systems (e.g., pipelined signal converters), buffer amplifiers provide an analog input signal to the analog-to-digital converter of a converter stage for conversion into a corresponding digital code and also provide the input signal to a switched-capacitor network of that stage for generation of a corresponding residue signal for processing by a succeeding converter stage. This residue signal generation is facilitated with a selected one of a set of reference signals wherein the selected reference signal is determined by the corresponding digital code.

If it is desired to increase a system's dynamic range (i.e., to increase the amplitude range of the analog input signals), the amplitude of the reference signals must also increase. Because at least one transistor of the buffer amplifier is generally exposed to the selected reference signal, the system's dynamic range must be limited so that the increased reference signals do not initiate transistor breakdown.

BRIEF SUMMARY OF THE INVENTION

The present invention is directed to buffer amplifiers that provide enhanced dynamic range. The novel features of the invention are set forth with particularity in the appended claims. The invention will be best understood from the following description when read in conjunction with the accompanying drawings.

BRIEF DESCRIPTION OF THE DRAWINGS

FIGS. 1A and 1B are schematics of a signal sampler embodiment of the present invention;

FIGS. 2A–2C are schematics that illustrate bias structure embodiments for a transistor follower in the system of FIGS. 1A and 1B;

DETAILED DESCRIPTION OF THE INVENTION

Figure 3:
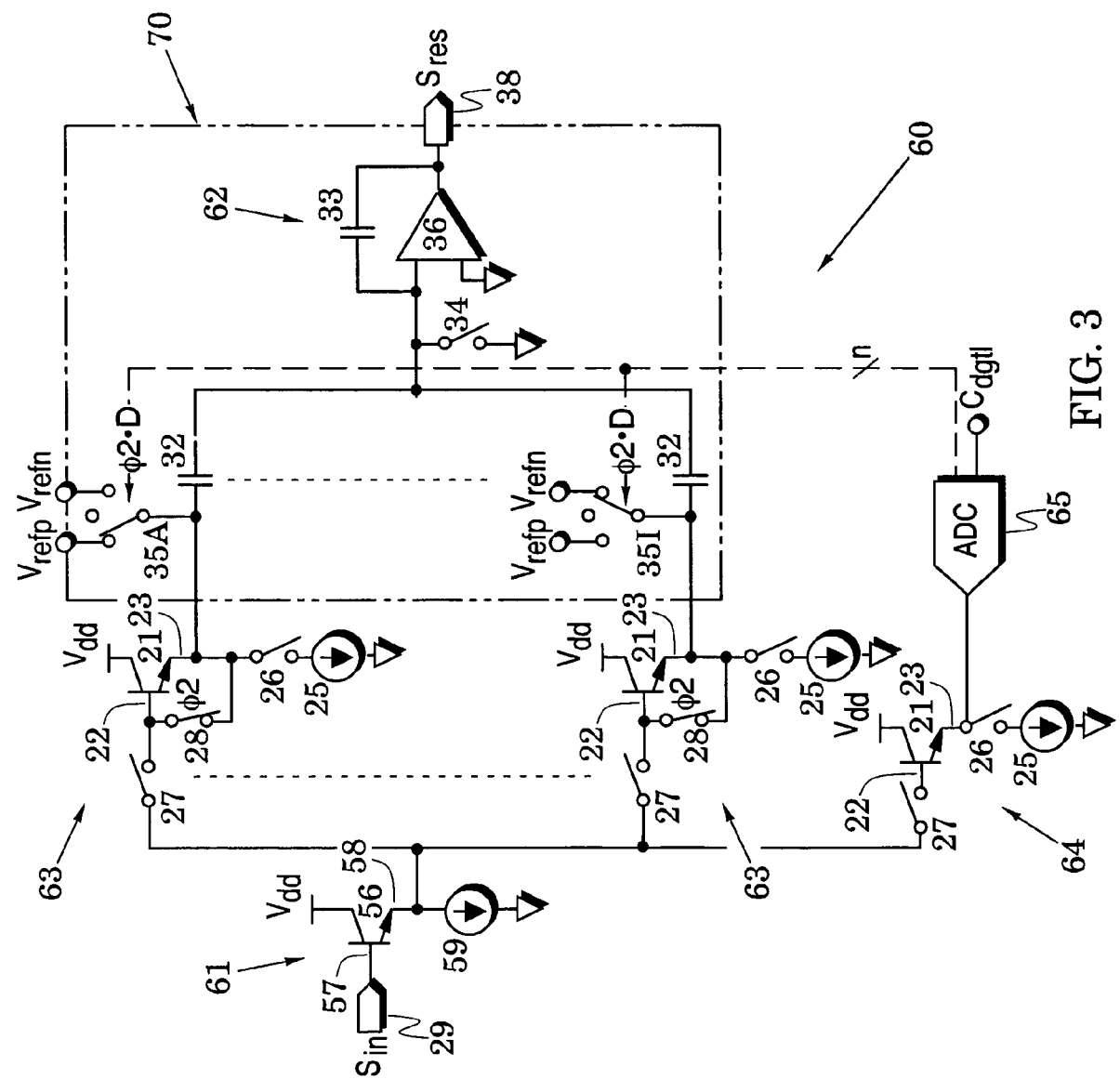
FIG. 3 is a schematic of another signal sampler embodiment.

FIGS. 1A–3 illustrate signal sampler embodiments that process input signals along signal paths in response to mode-command signals. These embodiments generally include a follower transistor with a control terminal and a current terminal that establish at least part of a signal path. They also include a switched-capacitor network that receives signals from the current terminal in response to a first mode-command signal and that couples a selected one of a set of reference signals to the current terminal in response to a second mode-command signal.

During the second mode-command signal, a bias switch is arranged to bias off the follower transistor by coupling a bias signal to the control terminal that approximates the selected reference signal. Accordingly, the amplitude of the reference signals can be increased to facilitate an increased dynamic range of the input signals without biasing the follower transistor into breakdown.

In contrast to the signal sampler embodiments of the present invention, conventional sampler structures limit the dynamic range because as values of the reference signals $V_{refp}$ and $V_{refn}$ are increased to extend sampler dynamic range, values are reached that break down the transistors (e.g., the transistor follower 21).

In particular, FIGS. 1A and 1B illustrate a signal sampler embodiment 20 that includes a buffer section which drives a switched-capacitor network 30. The buffer section has a follower transistor 21 that has a control terminal (i.e., base) 22 and a current terminal (i.e., emitter) 23, a current source 25, a current switch 26, a path switch 27 and a bias switch 28. The current switch 25 couples the current source 25 to the current terminal, the path switch 27 couples the control terminal to a sampler input port 29, and the bias switch 28 is coupled between the control and current terminals.

The switched-capacitor network 30 has first and second capacitors 32 and 33, first and second switches 34 and 35, and a differential amplifier 36 that drives an output port 38. The first capacitor 32 has an upstream plate that is coupled to the current terminal 23 and to the first switch 34 and a downstream plate coupled to an inverting input of the differential amplifier 36. The second capacitor 33 has an upstream plate coupled to the inverting input of the differential amplifier and a downstream plate coupled to the output of the differential amplifier. The first switch 34 is coupled to the inverting input of the differential amplifier 36. The second switch 35 is coupled to the upstream plate of the first capacitor 32 and it is, therefore, also coupled to the current terminal 23.

The sampler 20 can be used, for example, in a pipelined analog-to-digital converter (ADC) system. In this application, the sampler typically operates in first and second operational modes which are respectively shown in FIGS. 1A and 1B. In the first operational mode of FIG. 1A, the transistor follower 21 receives analog input signals $S_{in}$ from the input port 29 and processes them along a first signal path 41 that passes through the first capacitor 32. Accordingly, the upstream switch 27 and the first switch 34 respond to a first mode-command signal φ1 (e.g., a clock signal) by closing to establish the signal path 40. In addition, the current switch 26 closes so that the current source 25 provides a bias current 39 to the transistor follower 21.

The processing of the transistor follower 21 is preferably conducted over a wide signal bandwidth and provides a high input impedance to the input port, a low output impedance to the switched-capacitor network 30, and substantial signal isolation between the network and the input port. The transistor follower 21 supplies signal current to drive the switched-capacitor network 30 and does this while keeping a voltage transfer (i.e., $V_{be}$) between its control and current terminals at a substantially fixed value.

It is noted that the voltage of a signal sample at the current terminal 23 "follows" the voltage at the control terminal 22 and that the transfer voltage is on the signal path 40. By keeping the transfer voltage substantially fixed, the transistor follower enhances the accuracy of the signal samples that are presented to the switched-capacitor network 30 and stored as electrical charges in the first capacitor 32. It is thus important to protect the transistor follower 21.

In the second operational mode of FIG. 1B, the upstream switch 27, the first switch 34, and the current switch 26 open in response to absence of the first mode-command signal φ1. A sample of the input signal $S_{in}$ is thus captured at the current terminal 23 and stored in the first capacitor 32. Preferably, the first switch 34 opens slightly early (in response to absence of an early version of the first mode-command signal φ1) to establish the capture and ignore signal transients originating from operation of the other switches.

In response to a second mode-command signal φ2 (e.g., a clock signal) that conveys a decision D, the second switch 35 couples the upstream plate of the first capacitor 32 to a selected one of reference signals $V_{refp}$ and $V_{refn}$ to thereby establish a second signal path 42 that transfers, to the second capacitor 33, the electrical charges that were captured in the first capacitor 32 at the end of the first operational mode. This transfer and the value of the selected reference signal generates a residue signal $S_{res}$ at the output port 38. The reference signal $V_{refn}$ is less than the reference signal $V_{refp}$ and these reference signals are generally spaced about a common-mode signal level $V_{cm}$. Although various common-mode levels may be used, that specifically illustrated in FIGS. 1A and 1B is indicated as a ground signal level.

As mentioned above, the sampler 20 can be used in association with at least one converter stage of a pipelined converter system. FIG. 2A thus indicates a system's converter stage 44 that is positioned to receive the captured signal from the transistor follower 21 and convert this signal into a corresponding digital code $C_{dgtl}$. The converter stage 44 (or circuits associated with this stage) also provides a decision D which selects an appropriate one of the reference signals $V_{refp}$ and $V_{refn}$.

The decision D is determined by the digital code $C_{dgtl}$ and is structured so that the generated residue signal $S_{res}$ at the output port 38 is suitable for processing by a succeeding converter stage of the pipelined converter system. For exemplary purposes, the selected reference signal is shown as $V_{refp}$ in FIG. 1B. The complete signal to the second switch 35 is shown as φ2•D to indicated that it conveys the decision D at the time of the second mode-command signal φ2.

As shown in FIG. 1B, the bias switch 28 closes in response to the second mode-command signal φ2 to thereby couple the selected reference signal to the control terminal 22. The selected reference signal thus becomes a bias signal which is applied to the control terminal to bias off the transistor follower 21 and insure that it does not generate a current which would degrade the value of the captured signal at the current terminal 23 during the presence of the second mode-command signal φ2.

In a feature of the present invention, the selected one of the reference signals is, therefore, not only provided to initiate charge transfer along the second signal path 42 but is also coupled to the control terminal 22 (via the bias switch 28) to bias off the transistor follower 21. Accordingly, the turnoff bias across the transistor follower is substantially zero volts whether the selected reference signal is $V_{refp}$ or $V_{refn}$. Thus, the transistor follower is securely turned off with a bias that continues to be substantially zero volts even though the absolute values of the reference signals reference signal $V_{refp}$ and $V_{refn}$ may be increased to handle a greater dynamic range of the input signal $S_{in}$ at the input port 29.

In contrast to the sampler structure of FIGS. 1A and 1B, the transistor follower 21 could be securely turned off by coupling the control terminal 22 to the lower reference signal $V_{refn}$ rather than to the selected reference signal. However, this conventional sampler structure would limit the dynamic range because as values of the reference signals $V_{refp}$ and $V_{refn}$ are increased to extend its dynamic range, values would be reached that could break down the transistor follower 21. This would occur when $V_{refp}$ is the selected reference signal and the distance between $V_{refp}$ and $V_{refn}$ exceeds the follower's safe reverse-voltage rating.

To enhance their dynamic range, signal sampler embodiments of the invention therefore couple a bias signal to the control terminal 22 that approximates the selected reference signal. FIG. 2A shows a structure embodiment 50 that duplicates the transistor follower and bias switch structures of FIG. 1B. In this sampler embodiment, the bias signal substantially equals the selected reference signal because whatever reference signal is coupled to the current terminal 23 (by the second switch 35 of FIG. 1B) is also coupled to the control terminal 22 by the bias switch 28.

FIG. 2B illustrates another structure embodiment 52 which is similar to the embodiment 50 except that the bias switch 28 responds to the complete signal φ2•D (the decision D conveyed by the second mode-command signal φ2) by coupling the control terminal 22 directly to a bias signal which is the selected reference signal. In this sampler embodiment, the bias signal again substantially equals the selected reference signal FIG. 2C illustrates another structure embodiment 54 which is similar to the embodiment 52 of FIG. 2B except that the bias signals now differ from the reference signals $V_{refp}$ and $V_{refn}$ by a margin $V_{mrgn}$ that further insures that the transistor follower is securely biased off. In a sampler embodiment, the absolute value of the margin may be up to and including 500 millivolts. In more conservative embodiments, the absolute value of the margin may be restricted to be less than 300 millivolts or restricted to a range of 200 to 300 millivolts.

It is noted that the margin $V_{mrgn}$ is subtracted from the selected one of the reference signals $V_{refp}$ and $V_{refn}$ in FIG. 2C because this causes it to differ in a direction which further insures the transistor is biased off. In a signal sampler embodiment in which the transistor follower 21 is a pnp bipolar transistor, the margin would be added to the selected one of the reference signals $V_{refp}$ and $V_{refn}$ because this causes it to differ in a direction which further insures the transistor is biased off.

The bias switch arrangement 50 of FIG. 2A (and FIG. 1B) is simple because it does not require that additional ones of the reference signals $V_{refp}$ and $V_{refn}$ be provided. To enhance the accuracy of the residue signal at the output port 38 of FIG. 1B, these reference signals must be generated with considerable precision and the generation and provision of additional versions increases current demand and increases fabrication costs. Because the bias switch arrangement of FIG. 2A operates with a bias signal that is simply coupled via the current terminal 33, it avoids these complications.

The reference signals $V_{refp}$ and $V_{refn}$ shown in FIGS. 2B and 2C may be the same set of reference signals that are applied to the switched-capacitor network 30 of FIGS. 1A and 1B or may be another set of bias signals that at least approximate the set of reference signals. In these sampler embodiments, the bias switch 28 couples (in response to the second mode-command signal) to a selected one of a plurality of switch terminals (the terminals of the bias switch 28) that each receive a different one of a set of bias signals that at least approximate the set of reference signals. The bias switch is directed to the selected terminal in response to the decision signal D. The bias signals may be approximate copies of the reference signals or may differ from them by a margin $V_{mrgn}$ as shown in FIG. 2C.

Although the bias switch arrangements 51 and 52 of FIGS. 2B and 2C may thus require that additional versions of the reference signals be provided, these arrangements retain substantial isolation between the control and current terminals 22 and 23. This isolation reduces the generation of spurious signals (e.g., switch glitches) that may degrade the accuracy of the residue signal $S_{res}$.

FIGS. 1A and 1B also show a second follower transistor 56 that has a second control terminal 57 coupled to the input port 29 and has a second current terminal 58 coupled to the path switch 27. The second follower transistor is inserted to extend upstream the signal path 40 of FIG. 1A and to further enhance the high input impedance, low output impedance, and signal isolation of the follower transistor 21. Current is provided to the second follower transistor by a second current source 59.

FIG. 3 illustrates another signal sampler 60 which includes elements of the sampler 20 of FIGS. 1A and 1B with like elements indicated by like reference numbers. The sampler 60 is configured to be associated with an N bit converter stage of a pipelined converter system and, accordingly, it receives an analog input signal at an input port 29 and, in response, generates a corresponding digital code and a residue signal $V_{res}$ at an output port 38 that can be processed by a succeeding converter stage.

In particular, an input portion 61 of the sampler 60 is formed by the input port 29, second transistor follower 56 and second current source 59 of FIGS. 1A and 1B and an output portion 62 is formed by the first switch 34, differential amplifier 36, second capacitor 33 and output port 38 of FIGS. 1A and 1B.

A middle portion 63 of the sampler 60 is formed by the remaining elements of FIGS. 1A and 1B (less the converter stage 44) and several of these middle portions 63 are coupled between the input and output portions 61 and 62. Finally, a buffer 64 is formed with the transistor follower 21, current source 25, current switch 26 and path switch 27 of FIGS. 1A and 1B and this buffer is arranged to drive an ADC 65 in response to the input signal that is received via the input portion 61. The first capacitors 32 and second switches 35 of the middle portions 63 and the output portion 62 can be considered to be a switched-capacitor network 70 which is similar to the network 30 of FIGS. 1A and 1B except that it includes a plurality of the first capacitors 32 and associated second switches 35.

An embodiment of the sampler 60 of FIG. 3 may include eight sets of the first capacitors 32 and associated second switches 35. This embodiment may be used, for example, in association with an ADC 65 that provides a 3 bit digital code in response to the analog input signal $S_{in}$ at the input port 29. The second switches are thus referenced with eight reference numbers that begin at 35A and terminate at 35I.

The switches of FIG. 3 are shown in an operational mode consistent with that of FIG. 1B. It is therefore assumed that, in an initial operation mode, the analog input signal $S_{in}$ has been previously processed along signal paths through the second transistor follower 56, the transistor followers 21 and the first switches 32. In the second operational phase shown in FIG. 3, each of the second switches 35 have moved in response to respective decisions D that have been conveyed with second mode-command signal φ2 to select a respective one of the reference signals $V_{refp}$ and $V_{refn}$. The respective decisions D are provided by the ADC 65 and correspond to the digital code that it has generated in response to the analog input signal $S_{in}$. As shown in FIG. 3, n (e.g., eight) of the decisions signals D are provided by the ADC 65 and respective ones of the decision signals are conveyed to respective ones of the second switches 35.

Each of the second switches 35 is thus set to couple a respective one of the reference signals $V_{refp}$ and $V_{refn}$ to the upstream plate of a respective one of the first capacitors 32. This action will transfer electrical charges to the second capacitors 33 to generate a residue signal $S_{res}$ that is appropriate for the analog input signal $S_{in}$ at the input port 29 and the corresponding digital code provided by the ADC 65.

In response to the second mode-command signal φ2, the bias switches 28 associated with each of the transistor followers 21 close to apply a bias signal to the corresponding control terminal 22 that equals the selected reference signal. In the exemplary response of FIG. 3, the second switch 35A has applied $V_{refp}$ to the first capacitor 32A and the second switch 35I has applied $V_{refn}$ to the first capacitor 32I. The bias signal is thus $V_{refp}$ in the upper of the middle portions 63 and $V_{refn}$ in the lower of the middle portions 63. In other embodiments, the bias switches can be altered to apply bias signals that substantially equal the selected reference signal (as in FIG. 2B) or to apply bias signals that exceed the selected reference signal by a predetermined margin (as in FIG. 2C).

Figure 4:
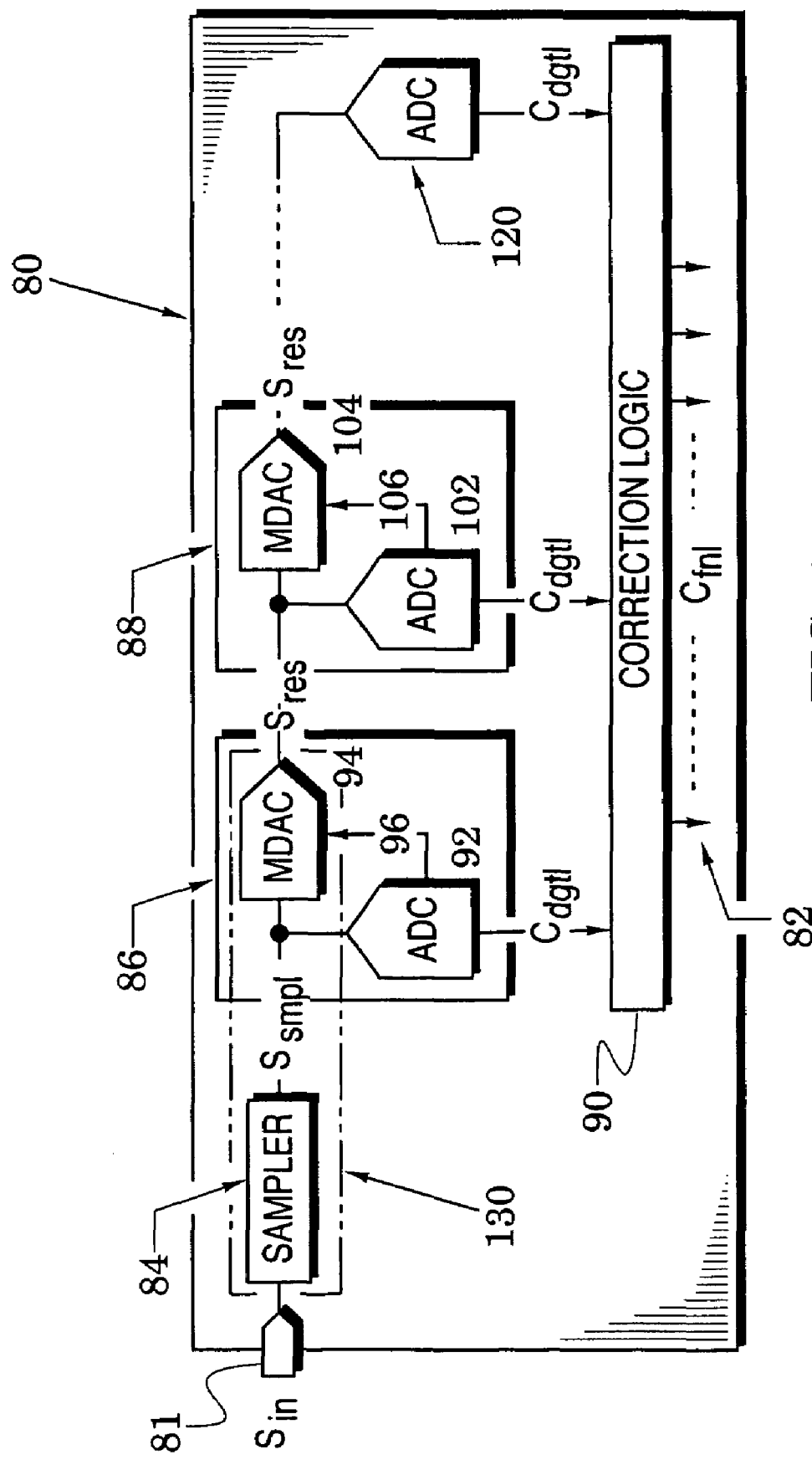
FIG. 4 is a block diagram of a pipelined signal converter that includes signal sampler embodiments.

The signal sampler embodiments of the present invention can be advantageously used in a variety of signal conditioning systems such as the pipelined converter system 80 of FIG. 4. The system 80 includes a sampler 84, an initial converter stage 86 and at least one successive converter stage 88 and converts an analog input signal $S_{in}$ at an input port 81 to a corresponding digital code signal $S_{code}$ at an output port 82. The conversion is accomplished by successive (i.e., pipelined) conversions in the successive converter stages.

In particular, the sampler 84 provides a sample signal $S_{smpl}$ in response to the input signal $S_{in}$ and the initial converter stage 86 processes the sample signal $S_{smpl}$ to provide respective digital codes and also provide a residue signal $S_{res}$ to a succeeding converter stage. In similar fashion, each successive converter stage 88 processes a preceding residue signal $S_{res}$ to provide respective digital codes $C_{dgtl}$ and provide a respective residue signal $S_{res}$ to a succeeding converter stage. However, the final one of the successive converter stages only provides respective digital codes $C_{dgtl}$ as it has no need to provide a residue signal. The converter stages of the system 80 are generally configured to provide extra digital bits so that the system can include a correction logic 90 which corrects processing errors and generates the final digital code signal $C_{fnl}$.

The initial converter stage 88 typically has an initial converter 92 (e.g., a flash ADC) that converts the sample signal $S_{smpl}$ to respective digital bits $D_r$. The initial converter stage also has a multiplying digital-to-analog converter (MDAC) 94 that receives the sample signal $S_{smpl}$ and also receives a decision signal 96 from the initial converter 86. The decision signal indicates which of possible digital bits $D_r$ is being provided at any given moment by the initial converter 86. Exemplary decision signals are the reference signals $V_{refp}$ and $V_{refn}$ that are applied to the second switches 35 in FIGS. 1A, 1B and 3. In response to the sample signal $S_{smpl}$ and the decision signal 96, the MDAC 94 provides a residue signal $S_{res}$ for processing by the successive converter stage 88.

The successive converter stages 88 processes the residue signal $S_{res}$ of the preceding stage and is configured similarly to the initial converter stage 86. For example, it has a successive converter 102 and an MDAC 104 that receives a decision signal 106 from the successive converter 102. In contrast, the final converter stage is formed with just a respective converter 120.

In FIG. 4, a signal sampler 130 is indicated by a broken-line box that includes the sampler 84 and the MDAC 94. In a system embodiment, the signal sampler 130 is an embodiment similar to the signal buffer embodiments illustrated in FIGS. 1A, 1B and 3.

Although the signal samplers of FIGS. 1A, 1B and 3 are illustrated as single-ended sampler structures for simplicity and clarity of illustration, they are also intended to teach differential sampler embodiments. As previously mentioned, these signal sampler embodiments are generally associated with at least a first reference signal $V_{refp}$ and a second reference signal $V_{refn}$ that is less than $V_{refp}$ wherein these reference signals are typically spaced about a common-mode signal level $V_{cm}$.

Although embodiments of the invention have been described with combinations of specific transistor types, other embodiments may include different combinations. For example, the transistor follower 21 is shown as an emitter follower in FIGS. 1A, 1B and 3 but, in other sampler embodiments, it can be replaced with a source follower 141 as indicated by the replacement arrow 142 of FIG. 1B.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A signal sampler that processes signals along a signal path in response to mode-command signals comprising:
   a follower transistor having a control terminal and a current terminal that establish at least part of said signal path;
   a switched-capacitor network configured to receive signals from said current terminal in response to a first mode-command signal and to couple a selected one of a set of reference signals to said current terminal in response to a second mode-command signal; and
   a bias switch that is connected between said control terminal and said current terminal and that, in response to said second mode-command signal, connects said control terminal to said current terminal to thereby apply said selected reference signal to said control terminal.

2. The sampler of claim 1, wherein said switched-capacitor network includes:
   an amplifier;
   a first capacitor coupled between said current terminal and said amplifier;
   a second capacitor coupled about said amplifier; and
   a reference switch arranged to couple said selected reference signal to said current terminal.

3. The sampler of claim 1, wherein said switched-capacitor network includes:
   at least one capacitor that has a capacitor plate coupled to said follower current terminal; and
   at least one reference switch arranged to couple said selected reference signal to said capacitor plate.

4. The sampler of claim 1, further including:
   a current source; and
   a current switch inserted to couple said current source to said current terminal in response to said first mode-command signal and to isolate said current source from said current terminal in response to absence of said first mode-command signal.

5. The sampler of claim 1, further including:
   a second follower transistor having a second control terminal and a second current terminal;
   a second current source that provides a second current to said second current terminal; and
   a path switch that, in response to said first mode-command signal, couples said control terminal to said second current terminal to thereby extend said signal oath to said second control terminal.

6. A signal sampler that processes signals along a signal path in response to mode-command signals comprising:
   a follower transistor having a control terminal and a current terminal that establish at least part of said signal path;
   a switched-capacitor network configured to receive signals from said current terminal in response to a first mode-command signal and to couple a selected one of a set of reference signals to said current terminal in response to a second mode-command signal; and
   a bias switch that, in response to said second mode-command signal, is arranged to bias off said follower transistor by coupling a bias signal to said control terminal that approximates said selected reference signal;
   wherein:
   in response to said second mode-command signal, said bias switch couples to a selected one of a plurality of switch terminals that each receive a different one of a set of bias signals that at least approximate said set of reference signals; and
   said bias switch is directed to said selected terminal in response to a decision signal.

7. The sampler of claim 6, wherein each of said bias signals differs from a respective one of said reference signals by a margin which further insures that said follower transistor is biased off.

8. The sampler of claim 7, wherein said margin is less than 300 millivolts.

9. The sampler of claim 6, wherein said switched-capacitor network includes:
   at least one capacitor that has a capacitor plate coupled to said follower current terminal; and
   at least one reference switch arranged to couple said selected reference signal to said capacitor plate.

10. The sampler of claim 1, further including:
    a current source; and
    a current switch inserted to couple said current source to said current terminal in response to said first mode-command signal and to isolate said current source from said current terminal in response to absence of said first mode-command signal.

11. The sampler of claim 6, further including:
    a second follower transistor having a second control terminal and a second current terminal;
    a second current source that provides a second current to said second current terminal; and
    a path switch that, in response to said first mode-command signal, couples said control terminal to said second current terminal to thereby extend said signal path to said second control terminal.

12. A signal sampler system that processes signals along signal paths in response to mode-command signals, comprising:

follower transistors wherein each has a control terminal and a current terminal that establish at least part of a respective one of said signal paths;

a switched-capacitor network configured to receive a signal from each current terminal in response to a first mode-command signal and to couple a respective one of a set of reference signals to each current terminal in response to a second mode-command signal; and bias switches that are each connected between the control and current terminals of a respective one of said follower transistors and, in response to said second mode-command signal, connects that control terminal to that current terminal to thereby apply said selected reference signal to that control terminal.

13. The sampler of claim 12, further including an additional follower transistor having a second control terminal and a second current terminal;

a second current source that provides a second current to said second current terminal; and a path switch that, in response to said first mode-command signal, couples said second current terminal to the control terminals of said follower transistors to thereby extend said signal path to said second control terminal.

14. A signal sampler system that processes signals along signal oaths in response to mode-command signals, comprising:

follower transistors wherein each has a control terminal and a current terminal that establish at least part of a respective one of said signal paths;

a switched-capacitor network configured to receive a signal from each current terminal in response to a first mode-command signal and to couple a respective one of a set of reference signals to each current terminal in response to a second mode-command signal; and bias switches that each, in response to said second mode-command signal, biases off a respective follower transistor by coupling a respective bias signal to that transistor's control terminal that approximates that transistor's respective reference signal;

wherein:

in response to said second mode-command signal, each of said bias switches couples to a selected one of a plurality of switch terminals that each receive a different one of a set of bias signals that at least approximate said set of reference signals; and each of said bias switches is directed to its selected terminal in response to a decision signal.

15. The sampler of claim 14, wherein each of said bias signals differs from a respective one of said reference signals by a margin which further insures that said follower transistor is biased off.

16. The sampler of claim 15, wherein said margin is less than 300 millivolts.

17. A signal converter system for converting an analog input signal into a corresponding digital code, the system comprising:

at least two converter stages coupled in series to receive said analog input signal and each convert a respective portion of said analog input signal into a respective code portion of said digital code wherein at least one of said stages includes:

an analog-to-digital converter that provides that stage's code portion and a selected one of a set of reference signals; and a signal sampler that processes signals along a signal path to a succeeding converter stage in response to mode-command signals wherein said sampler includes:

a) a follower transistor having a follower control terminal and a follower current terminal that establish at least part of said signal path;

b) a switched-capacitor network configured to receive signals from said follower current terminal in response to a first mode-command signal and to couple said selected reference signal to said follower current terminal in response to a second mode-command signal; and c) a bias switch that, in response to said second mode-command signal, bias off said follower transistor by coupling a bias signal to said follower control terminal that approximates said selected reference signal;

and wherein, in response to said second mode-command signal, said bias switch couples to a selected one of a plurality of switch terminals that each receive a different one of a set of bias signals that at least approximate said set of reference signals; and said bias switch is directed to said selected terminal in response to a decision signal.

18. The sampler of claim 17, wherein said bias signal substantially equals said selected reference signal.

19. The sampler of claim 17, wherein said bias signal differs from said selected reference signal by a margin which further insures that said follower transistor is biased off.

20. The sampler of claim 17, wherein said margin is less than 300 millivolts.

* * * * *